(12) United States Patent
Fischer et al.

(10) Patent No.: US 6,778,407 B2
(45) Date of Patent: Aug. 17, 2004

(54) PORTABLE DATA CARRIER

(75) Inventors: Jürgen Fischer, Deuerling (DE);
Manfred Fries, Hunderdorf (DE);
Frank Püschner, Kelheim (DE);
Annemarie Seidl, Heimberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/211,077

(22) Filed: Aug. 2, 2002

(65) Prior Publication Data

US 2003/0016507 A1 Jan. 23, 2003

Related U.S. Application Data

(63) Continuation of application No. PCT/DE01/00143, filed on Jan. 15, 2001.

(30) Foreign Application Priority Data

Feb. 2, 2000 (EP) .............................................. 00102073

(51) Int. Cl.[7] .................................................. H05K 7/10
(52) U.S. Cl. ........................ 361/777; 361/737; 361/748; 361/761; 361/767; 361/772; 361/776; 257/669; 257/692
(58) Field of Search ................................ 361/737, 748, 361/751, 760–761, 767, 772–774, 776, 777; 257/679, 669, 690, 692, 773; 235/492, 491, 488; 174/250; 438/125

(56) References Cited

U.S. PATENT DOCUMENTS

| 4,701,236 A | * | 10/1987 | Vieilledent .................. 156/252 |
| 5,057,460 A | | 10/1991 | Rose |
| 5,834,755 A | * | 11/1998 | Haghiri-Tehrani et al. .. 235/492 |
| 5,847,372 A | | 12/1998 | Kreft |
| 5,969,951 A | * | 10/1999 | Fischer et al. .............. 361/737 |

FOREIGN PATENT DOCUMENTS

| EP | 0 716 394 A2 | 6/1996 |
| FR | 2 634 095 | 1/1990 |
| JP | 02 030 598 | 1/1990 |

* cited by examiner

Primary Examiner—Phuong T. Vu
(74) Attorney, Agent, or Firm—Laurence A. Greenberg; Werner H. Stemer; Gregory L. Mayback

(57) ABSTRACT

A portable data carrier includes a card-shaped body having a recess for receiving a chip module. The chip module includes at least one semiconductor chip on a first main side of a chip carrier connected to the card-shaped body, and a metallization layer disposed on a second main side of the chip carrier and having contact lugs. The chip carrier has desired bending points which, upon the occurrence of bending stresses, reduce forces on the semiconductor chip and wire connections.

8 Claims, 3 Drawing Sheets

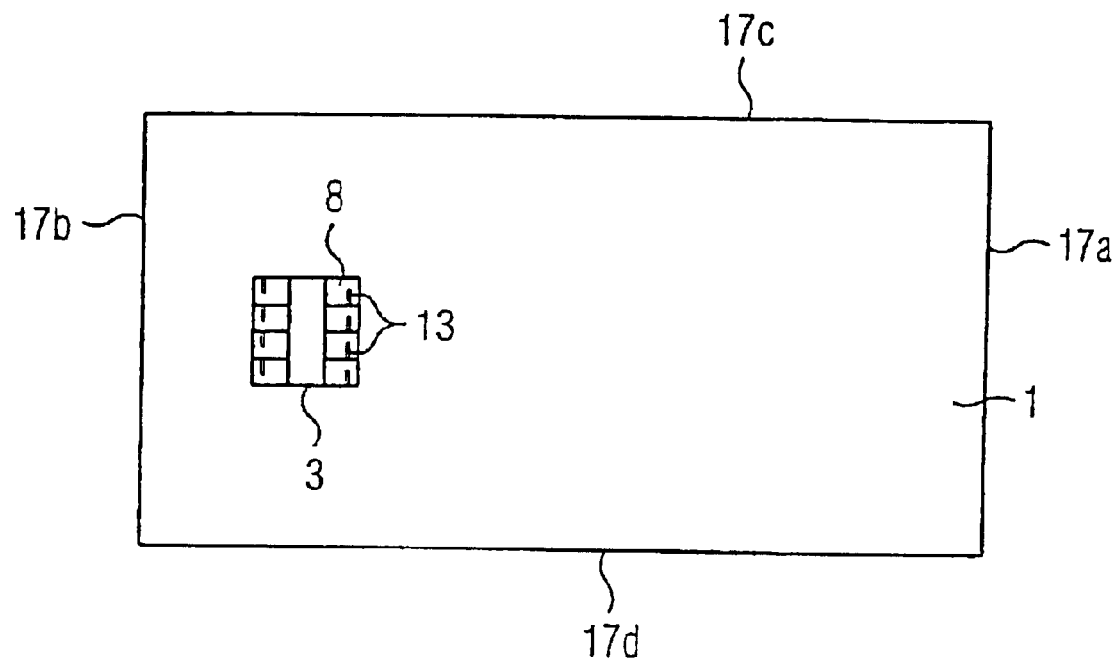

PORTABLE DATA CARRIER

CROSS-REFERENCE TO RELATED APPLICATION

This application is a continuation of copending International Application No. PCT/DE01/00143, filed Jan. 15, 2001, which designated the United States and was not published in English.

BACKGROUND OF THE INVENTION

Field of the Invention

The invention relates to a portable data carrier including a card-shaped or card-type body having a recess for receiving a chip module. The chip module includes at least one semiconductor chip on a first main side of a chip carrier connected to the card-shaped body, and a metallization layer disposed on a second main side of the chip carrier and having contact lugs.

Such portable data carriers are well known from the prior art. They are typically embodied in a card form (for example in the credit card format) with an incorporated integrated circuit module. The data carriers are then referred to as smart cards. Data carriers of the above-mentioned type are exposed to a wide variety of loads during use. Due to structural conditions with a card body and a chip module, high bending loads can act on the configuration and, depending on the structural layout, can lead to failures, caused for example by a chip fracture or the tearing of an electrical connection. The susceptibility of a configuration of that type is dependent on the chip size, on the length of a bonding wire connection between contact pads of a semiconductor chip and on the materials used.

A chip module known from the prior art usually has a carrier composed of epoxy resin. A semiconductor chip is applied on a first main side of the carrier. The chip is connected to the carrier, for example by adhesive bonding or lamination. A metallization layer is applied on a second main side of the carrier opposite to the first main side. The metallization layer has contact lugs and forms contacts of the chip module that are subsequently accessible externally. The metallization layer typically has six or eight contact lugs which are electrically isolated from one another and in each case are connected to contact pads of the semiconductor chip by bonding wires. In that case, the bonding wires are led through recesses in the carrier. A potting compound is applied on the first main side and surrounds the semiconductor chip and the bonding wires for mechanical protection of the semiconductor chip and of the bonding wires.

If the data carrier is exposed to bending loads, as occur for example in mail sorting installations during postal shipping, the data carrier can be damaged. The dictates of construction mean that a high kinetic energy acts there on the data carrier in a mail envelope. That energy is brought about on one hand by high speed and on the other hand by frequent changes in direction through movable rollers of the mail sorting installation.

In order to minimize the forces acting on the data carrier configuration, attempts have been made to divert the applied tensile and compressive forces to the adhesive connection between the chip module and the card-shaped body of the data carrier. That is done either by increasing the module bending resistance in the semiconductor chip and in the bonding wire region by using particularly hard coverings or by the use of reinforcement elements, for example frames on the first main side of the chip carrier. Based on good practical experience, there has been a shift toward using a so-called "hot-melt" adhesive, for connecting the chip module to the card-shaped body, since that has proved to be particularly advantageous due to its elastic properties.

Nevertheless, damage to the semiconductor chip or the bonding wire connections in the chip module can occur in the event of high bending stresses.

SUMMARY OF THE INVENTION

It is accordingly an object of the invention to provide a portable data carrier which overcomes the hereinafore-mentioned disadvantages of the heretofore-known devices of this general type and which has a high reliability even in the event of high bending stresses.

With the foregoing and other objects in view there is provided, in accordance with the invention, a portable data carrier, comprising a card-shaped body having a recess formed therein and defining side edges. A chip module is to be disposed in the recess. The chip module has a chip carrier connected to the card-shaped body. The chip carrier has desired bending points located in a region within the side edges of the recess. The chip carrier has first and second main sides. The chip module has at least one semiconductor chip disposed on the first main side and a metallization layer disposed on the second main side. The metallization layer has contact lugs.

The invention is based on the insight that the flexure of the semiconductor chip or of the entire chip module becomes smaller as the dimensions of the chip module are made smaller. However, since the chip modules or portable data carrier configurations described in the introduction have to meet predetermined standards (ISO standard) it is not possible to arbitrarily reduce the size of the chip module. Therefore, the invention provides for the chip carrier to have desired bending points. Since, in principle, the weakest point yields in the event of bending stresses that occur, it is possible, through the use of a suitable configuration of the desired bending points in the chip carrier, to accommodate the semiconductor chip and the electrical connections (bonding wires) on an area that is resistant to bending. In other words, the invention thus provides for a stiff region of the chip module to be expanded in such a way that not only the semiconductor chip but also the wire bonding connections lie in the stiff region.

In accordance with another feature of the invention, the desired bending points are located in a region outside the semiconductor chip. It is even more advantageous if the desired bending points are disposed outside a covering surrounding the semiconductor chip. Since the desired bending points are simultaneously located in a region within the side edges of the recess, the forces acting on the portable data carrier can be kept away from the semiconductor chip and the electrical connections to the greatest possible extent.

In accordance with a further feature of the invention, the desired bending points are formed by at least one cutout in each contact lug of the metallization layer. The cutout subdivides the respective contact lug into a first and a second region. The at least one cutout in each contact lug weakens the metallization layer in this region which has the highest bending resistance of the entire chip module. The chip carrier itself, while being significantly thicker than the metallization layer, has a significantly lower bending resistance. As a result of this, the desired bending point sought is produced at the points of the cutout.

In accordance with an added feature of the invention, the first and second regions are connected to one another by at least one web. In this case, it is possible to refine the contact lugs by electroplating without modifying existing production tools or production cuts, which is a tried and tested and cost-effective method. If the cutout of the first and the second region were completely separated from one another, then the contact lugs would have to be refined by electroless plating.

In accordance with an additional feature of the invention, the cutouts run in a direction in the respective contact lugs in which the contact lugs lie adjacent one another. The cutouts of adjacent contact lugs lie on an axis in this case. This axis lies substantially parallel to the side edges of the semiconductor chip. Under no circumstances does it lead through the semiconductor chip. In that case, perforation of the semiconductor chip would be promoted.

In accordance with yet another feature of the invention, the respective webs have a significantly smaller width than the at least one cutout. The width of the web remaining in the contact lug substantially determines the bending resistance of the desired bending point. The minimum possible width of the web results from the electroplating requirements.

In accordance with a concomitant feature of the invention, as an alternative, the metallization layer could also end in a region within the desired bending points. This means nothing more than that the first region of the contact lug, which region is formed by the cutout, is obviated.

Other features which are considered as characteristic for the invention are set forth in the appended claims.

Although the invention is illustrated and described herein as embodied in a portable data carrier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a plan view of a portable data carrier in which a position of desired bending points with respect to a card-shaped body becomes apparent.

DESCRIPTION OF THE PREFERRED EMBODIMENTS

Figure 1:
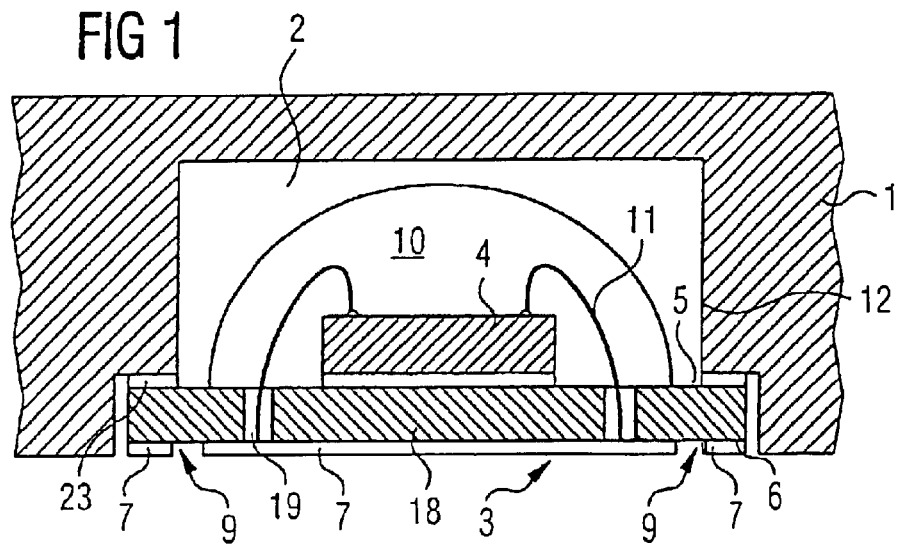
FIG. 1 is a fragmentary, diagrammatic, cross-sectional view of a first embodiment of a portable data carrier according to the invention.

Referring now to the figures of the drawings in detail and first, particularly, to FIG. 1 thereof, there is seen a portion of a portable data carrier according to the invention. A chip module 3 is introduced in a known manner into a recess 2 of a card-shaped or card-type body 1. The chip module 3 includes a chip carrier 18 having a first main side 5 on which a semiconductor chip 4 is applied. A metallization layer 7 is applied on a second main side 6 of the chip carrier 18. The metallization layer 7 has a plurality of contact lugs, which are not visible in FIG. 1. Each contact lug is connected to a contact pad of the semiconductor chip 4 through bonding wires 11. In this case, the bonding wires 11 are led through recesses 19 in the chip carrier 18 in order to meet the contact lug in the recess 19. The semiconductor chip 4 and the bonding wires 11 are furthermore surrounded by a covering 10, for example a plastic potting compound. The chip module 3 is connected to the card-shaped body 1 by adhesive bonds 23 at lateral edges of the chip carrier.

The adhesive bond 23 as well as the chip carrier 18, which is formed of epoxide, for example, are highly flexible due to the materials thereof. In contrast, however, the metallization layer 7 which is formed of copper, for example, has a high bending resistance. Consequently, desired bending points are produced at points of the metallization layer 7 at which the metallization layer is perforated. Desired bending points 9, which are thus formed by the chip carrier 18 and the particular configuration of the metallization layer 7, ideally lie outside a region in which the semiconductor chip 4 and the bonding wires 11 are situated. The greatest possible effect of the desired bending points is obtained when the latter are located within side edges 12 of the recess 2 and outside the covering 10. In this case, the desired bending points can perform the function of a cardanic "mount". When a bending stress occurs, the chip carrier bends away at the desired bending points, but only small forces are transmitted to the semiconductor chip and the bonding wires since they lie in a stiff region of the chip module.

Figure 2:
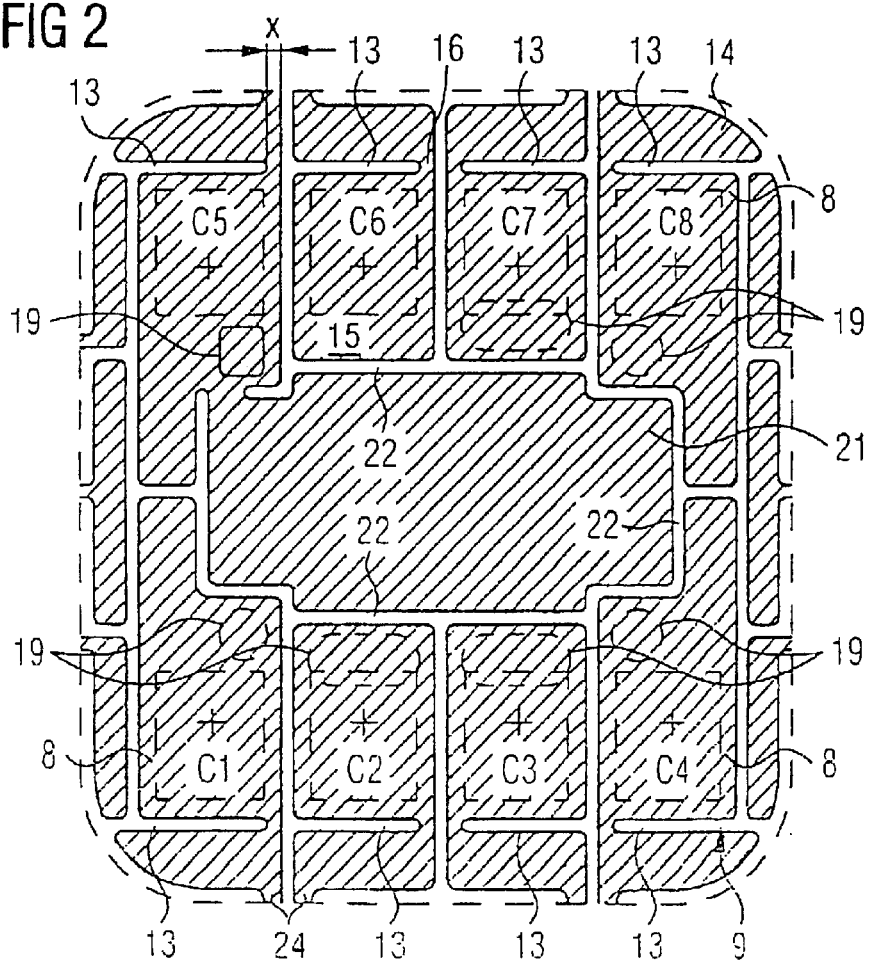
FIG. 2 is a plan view of a metallization layer of a chip module of FIG. 1.

FIG. 2 shows a plan view of a metallization layer 7, the configuration of which makes it possible to produce desired bending points in the chip carrier. The metallization layer has eight contact lugs 8. The latter are electrically isolated from one another by cutouts 22. A semiconductor chip is situated on the opposite main side of the non-illustrated chip carrier in a stiff region identified by reference numeral 21. The edges of the semiconductor chip do not extend beyond the region identified by reference numeral 21. Reference numeral 19 denotes points at which the non-illustrated chip carrier has the recesses through which bonding wires are led and are electrically connected to the contact lugs.

Rectangular regions C1 through C8 are locations, defined in ISO standard 7816, at which the contact lugs are contact-connected by an external read/write unit. The position and size of the contact areas on a contact lug and their configuration with respect to one another are precisely defined by the ISO standard.

In order to minimize the forces that occur in the event of bending stresses, the metallization layer could be reduced in size as far as the contact areas defined by the ISO standard. However, since the portable data carrier configurations according to the invention are produced in huge quantities, a modification of method processes and a change in requisite tools are associated with extraordinarily high costs. The invention therefore provides for cutouts 13 to be introduced into the metallization layer. The cutouts subdivide the contact lugs 8 in each case into a first region 14 and a second region 15. In the present exemplary embodiment, the first and second regions 14, 15 are connected to one another through narrow webs 16. The smaller the residual web 16 is made, the greater becomes the bending capability of the portable data carrier configuration at the desired bending points. A web width X is ideally between 0 and 0.2 mm. This configuration is advantageous when the contact areas or contact lugs are intended to be refined by electroplating.

Electrodes required for the electroplating are provided outside the metallized region shown in FIG. 2. The electroplating is performed at a point in time at which the metallization layer lies with a multiplicity of other metallization layers for modules on a continuous strip. In FIG. 2, it is still possible to discern separating points 24 by which the metallization layer was connected to the non-illustrated carrier strip.

Figure 3:
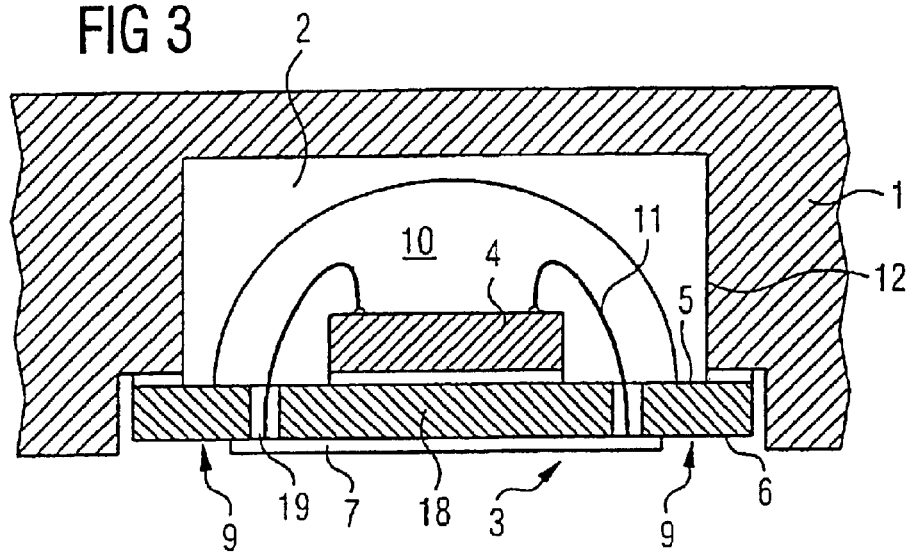
FIG. 3 is a fragmentary, cross-sectional view of a second exemplary embodiment of the portable data carrier according to the invention.

FIG. 3 shows a second exemplary embodiment of a portable data carrier configuration according to the invention, which differs from the configuration shown in FIG. 1 merely by the fact that the metallization layer 7 is completely omitted from the contact areas C1 through C8 defined by the ISO standard. This results in an uneven area between the card-shaped body 1 and the metallization layer 7 of the chip module 3. Although this is not disadvantageous from a technical standpoint, it might be undesirable for esthetic reasons.

Figure 4:
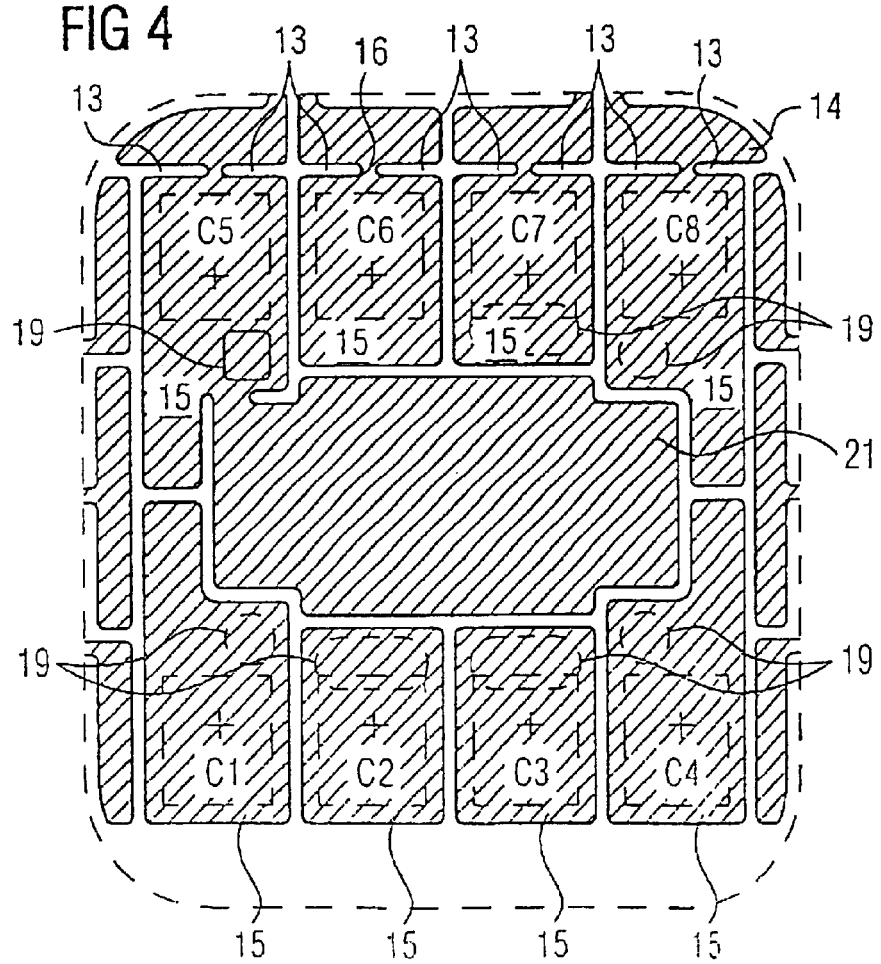
FIG. 4 is a plan view of an alternative configuration of the metallization layer of a chip module according to the invention.

FIG. 4 illustrates a plan view of an alternatively configured metallization layer 7. The contact lugs 8 located in the upper region each have two cutouts 13, so that a web 16 is produced approximately centrally in each contact lug. The cutouts 13 of the adjacent contact lugs are located in such a way that they lie on an axis. This axis runs approximately parallel to the position of the non-illustrated semiconductor chip on the opposite main side of the chip carrier. In the exemplary embodiments shown, the webs 16 are made significantly narrower relative to the width of the contact lugs. However, this need not necessarily be the case. The webs 16 could also be wider and, consequently, the cutouts 13 could be correspondingly narrower. The width of the webs 16 results in the desired bending capability at the desired bending points according to the invention.

The lower half of FIG. 4 shows a further variant of how the desired bending points can be produced in the chip carrier. In this variant, the contact lugs 8 only include the second region 15 in each case. The first region 14 formed by the cutouts 13, as illustrated in the upper half, is completely omitted from the lower contact lugs. This produces the depression, already described above, in the surface of the portable data carrier configuration. This variant is appropriate, however, only if the contact areas are refined by electrodeposition. Refinement by electroplating is then no longer possible with the customary tools.

FIG. 5 illustrates a card-shaped body 1 of the portable data carrier according to the invention, in a plan view. The data carrier has a chip module 3, provided with corresponding contact lugs 8, at the location determined by the ISO standard. Contact lugs 8 which lie directly alongside one another form an axis lying parallel to short side edges 17a, 17b of the card-shaped body. The cutouts 13 introduced into the contact lugs 8 likewise lie on an axis lying parallel to the short side edges 17a, 17b of the card-shaped body. This is due to the fact that the most critical bending stress runs parallel to long side edges 17c, 17d of the card-shaped body 1.

The bending stresses on a semiconductor chip and wire connections can be reduced by the provision of desired bending points in a chip carrier of a chip module. The desired bending points are produced by a special layout of the metallization layer applied on the chip carrier, while taking the ISO 7816 standard into account. This makes it possible to dispense with the customary reinforcement elements so that costs can be saved.

What is claimed is:

1. A portable data carrier, comprising:

a card-shaped body having a recess formed therein, said recess defining side edges; and a chip module to be disposed in said recess, said chip module having a plastic chip carrier connected to said card-shaped body, said chip carrier having desired bending points located in a region within said side edges of said recess, said chip carrier having first and second main sides, said chip module having at least one semiconductor chip disposed on said first main side, said chip module having a metallization layer disposed on said second main side, said metallization layer having contact lugs, and said bending points remaining uncovered by said metallization layer.

2. The portable data carrier according to claim 1, wherein said desired bending points are located in a region outside said semiconductor chip.

3. The portable data carrier according to claim 1, which further comprises a covering surrounding said semiconductor chip, said desired bending points located outside said covering.

4. The portable data carrier according to claim 1, wherein said desired bending points are formed by at least one cutout in each respective one of said contact lugs, said at least one cutout subdividing each of said respective contact lugs into first and second regions.

5. The portable data carrier according to claim 4, which further comprises at least one web interconnecting said first and second regions.

6. The portable data carrier according to claim 4, wherein said contact lugs lie adjacent one another in a given direction, and said cutouts run in said given direction.

7. The portable data carrier according to claim 5, wherein said at least one web has a smaller width than said at least one cutout.

8. The portable data carrier according to claim 1, wherein said metallization layer ends in a region within said desired bending points.

* * * * *